(12) United States Patent
Rossmeier et al.

(10) Patent No.: US 6,800,925 B2
(45) Date of Patent: Oct. 5, 2004

(54) INTEGRATED CIRCUIT CONFIGURATION HAVING A STRUCTURE FOR REDUCING A MINORITY CHARGE CARRIER CURRENT

(75) Inventors: Ludwig Rossmeier, München (DE); Norbert Krischke, München (DE); Wolfgang Werner, München (DE); Peter Nelle, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/349,822

(22) Filed: Jan. 23, 2003

(65) Prior Publication Data
US 2003/0136990 A1 Jul. 24, 2003

(30) Foreign Application Priority Data
Jan. 23, 2002 (DE) .......................................... 102 02 479

(51) Int. Cl.[7] .............................................. H01L 29/00
(52) U.S. Cl. ...................................... 257/547; 257/297
(58) Field of Search ................................. 257/297, 547

(56) References Cited

U.S. PATENT DOCUMENTS

| | | |
|---|---|---|
| 3,602,781 A | 8/1971 | Hart |
| 3,983,620 A | 10/1976 | Spadea |
| 4,117,507 A * | 9/1978 | Pacor .......................... 257/547 |
| 4,320,409 A * | 3/1982 | Shoji ........................... 257/373 |
| 4,593,459 A | 6/1986 | Poppert et al. |
| 4,746,967 A * | 5/1988 | Emoto et al. ................ 257/489 |
| 4,914,496 A * | 4/1990 | Nakagawa et al. .......... 257/138 |
| 4,922,317 A | 5/1990 | Mihara |
| 5,719,431 A | 2/1998 | Werner |
| 5,734,175 A * | 3/1998 | Taniguchi ..................... 257/48 |
| 5,942,783 A | 8/1999 | Brambilla et al. |

FOREIGN PATENT DOCUMENTS

| | | |
|---|---|---|
| DE | 42 09 523 C1 | 3/1993 |
| EP | 0 725 442 A1 | 8/1996 |

* cited by examiner

*Primary Examiner*—Allan R. Wilson
(74) *Attorney, Agent, or Firm*—Laurence A. Greenberg; Werner H. Stemer; Ralph E. Locher

(57) ABSTRACT

An integrated circuit configuration includes a semiconductor body having a first semiconductor zone of a first conductivity type in a region near a rear side and a second semiconductor zone of the first conductivity type adjoining the first semiconductor zone and doped more weakly than the first semiconductor zone in a region near a front side, a first component region in the body having at least one semiconductor zone of a second conductivity type, a second component region in the body having at least one semiconductor zone of the second conductivity type, and a conversion structure having a semiconductor zone of the second conductivity type and a semiconductor zone of the first conductivity type that are short-circuited and disposed at a distance from the first semiconductor zone between the first and second component regions in the second semiconductor zone.

9 Claims, 3 Drawing Sheets

INTEGRATED CIRCUIT CONFIGURATION HAVING A STRUCTURE FOR REDUCING A MINORITY CHARGE CARRIER CURRENT

BACKGROUND OF THE INVENTION

Field of the Invention

The present invention relates to an integrated circuit configuration having a structure for reducing a minority charge carrier current.

In integrated circuit configurations, in particular, in integrated circuit configurations in which a vertical power component and a control or processing circuit are integrated in a semiconductor body, it is adequately known that, under specific operating states determined by the external circuitry, the power component can inject minority charge carriers into the substrate or into an epitaxial layer applied to the substrate, which do not flow away through the terminals of the power component. These charge carriers injected into the substrate or the epitaxial layer can propagate there and disturb the control or processing circuit unless suitable measures are taken to prevent such propagation.

German Patent DE 42 09 523 C1 discloses disposing an annular structure in an epitaxial layer on a substrate around a component region that potentially injects minority charge carriers. The structure includes a heavily doped zone of the same conduction/conductivity type as the substrate, which reaches from a front side of the semi-conductor body as far as the substrate, and a heavily doped zone of a complementary conductivity type with respect to the doping of the substrate, which, likewise, reaches as far as the substrate proceeding from the front side, the two zones being short-circuited. If, in the case of this configuration, charge carriers are injected into the substrate, then a current flow in the annular structure pulls the substrate to a lower potential in order to reduce the injection of charge carriers.

Comparable structures for reducing the propagation of minority charge carriers or the injection of minority charge carriers are described in U.S. Pat. No. 5,719,431 to Werner and European Patent Application EP 0 725 442, corresponding to U.S. Pat. No. 5,942,783 to Brambilla et al.

SUMMARY OF THE INVENTION

It is accordingly an object of the invention to provide an integrated circuit configuration having a structure for reducing a minority charge carrier current that overcomes the hereinafore-mentioned disadvantages of the heretofore-known devices of this general type and that has a structure for reducing a propagation of minority charge carriers.

With the foregoing and other objects in view, there is provided, in accordance with the invention, an integrated circuit configuration, including a semiconductor body having a rear side, a front side, a first semiconductor zone of a first conductivity type in a region of the rear side, and a second semiconductor zone of the first conductivity type adjoining the first semiconductor zone, the second semiconductor zone doped weaker than the first semiconductor zone and disposed in a region of the front side, a first component region in the semiconductor body having at least one semiconductor zone of a second conductivity type, a second component region in the semiconductor body having at least one semiconductor zone of the second conductivity type, and a conversion structure having a first structure semiconductor zone of the second conductivity type and a second structure semiconductor zone of the first conductivity type, the first structure semiconductor zone and the second structure semiconductor zone being short-circuited and respectively disposed at a distance from the first semiconductor zone in the second semiconductor zone between the first and second component regions.

The first semiconductor zone represents a semiconductor substrate, for example, and the second semiconductor zone and epitaxial layer applied to the semiconductor substrate. A first component region, which has at least one semiconductor zone of a second conductivity type, and a second component region, which has at least one semiconductor zone of the second conductivity type, are formed in the semiconductor body. To prevent or at least reduce the propagation of minority charge carriers in the second semiconductor zone, there is a conversion structure present between the first and second component regions in the second semiconductor zone, the conversion structure having a semiconductor zone of the second conductivity type and a semiconductor zone of the first conductivity type, which are short-circuited and which are, in each case, disposed at a distance from the first semiconductor zone between the first and second component regions in the second semiconductor zone.

The semiconductor zone of the second conductivity type in the second semiconductor zone in the first component region is, preferably, part of a vertical semiconductor component having at least a first and a second terminal electrode, the first terminal electrode being connected to the first semiconductor zone and the second terminal electrode being connected to the semiconductor zone of the second conductivity type.

If, in the case of the semiconductor component according to the invention, minority charge carriers are injected into the second semiconductor zone, then, they are taken up by the conversion structure and converted into majority charge carriers that are injected into the second semiconductor zone again. The majority charge carriers can, then, flow away through the terminal electrodes. By converting the minority charge carriers into majority charge carriers, the conversion structure prevents the propagation of minority charge carriers in the second semiconductor zone, which might otherwise pass to zones of the second conductivity type in the second component region and influence the functioning of components realized there.

The power component in the first component region may be configured as a diode, the first semiconductor zone or the semiconductor substrate forming the cathode in the case of n-type doping and the zone of the second conductivity type, which is then p-doped, forming the anode.

The power component may also be configured as a MOS transistor, in which case at least one further zone of the first conductivity type is disposed in the zone of the second conductivity type and a gate electrode is present that is insulated from the zone of the first conductivity type and the zone of the second conductivity type. The zone of the second conductivity types forms the body zone of the MOS transistor, which is short-circuited with the zone of the first conductivity type, which forms the source zone, by a source electrode. The first semiconductor zone forms the drain zone of the MOS transistor.

A MOS transistor as power component injects minority charge carriers into the second semiconductor zone, which serves as a drift path, if it is operated in the reverse direction, that is to say, if the potential at the source terminal is lower than at the drain terminal and the internal body diode, thus, turns on. The minority charge carriers are holes in the case of an n-conducting transistor.

A diode as power component injects minority charge carriers if it is operated in the forward direction.

In accordance with another feature of the invention, there are provided semiconductor zones of the first conductivity type connected to the first terminal electrode, the semiconductor zones disposed in the at least one semiconductor zone of the second conductivity type in the second semiconductor zone.

In accordance with a further feature of the invention, there is provided a control electrode in the first component region insulated from the semiconductor body adjacent the at least one semiconductor zone of the second conductivity type and at least one of the semiconductor zones of the first conductivity type, the at least one semiconductor zone being formed in the at least one semiconductor zone of the second conductivity type.

In accordance with an added feature of the invention, there is provided at least one further semiconductor zone of the first conductivity type disposed in the at least one semiconductor zone of the second conductivity type in the second semiconductor zone in the first component region.

In accordance with an additional feature of the invention, at least two of the semiconductor zones of the first conductivity type are disposed in the at least one semiconductor zone of the second conductivity type in the second semiconductor zone in the first component region.

In accordance with yet another feature of the invention, the zone of the first conductivity type and the zone of the second conductivity type of the conversion structure directly adjoin one another, while they are disposed at a distance from one another in the case of a further embodiment. The short circuit between these two zones is, preferably, formed by a layer made of a metal or polysilicon, which is applied to the front side of the semiconductor body.

Moreover, in accordance with yet a further feature of the invention, the zone of the second conductivity type of the conversion structure extends, proceeding from the front side of the semiconductor body, further into the semiconductor body in the vertical direction than the zone of the first conductivity type of the conversion structure.

Preferably, a plurality of conversion structures with in each case a zone of a first conductivity type and a zone of a second conductivity type are disposed next to one another between the first and second component regions.

To obtain a particularly good effect of the conversion structure, in accordance with a concomitant feature of the invention, the conversion structure is formed annularly around the first component region in which minority charge carriers are potentially injected.

Other features that are considered as characteristic for the invention are set forth in the appended claims.

Although the invention is illustrated and described herein as embodied in an integrated circuit configuration having a structure for reducing a minority charge carrier current, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

In the figures, unless specified otherwise, identical reference symbols designate identical parts with the same meaning.

Figure 1:
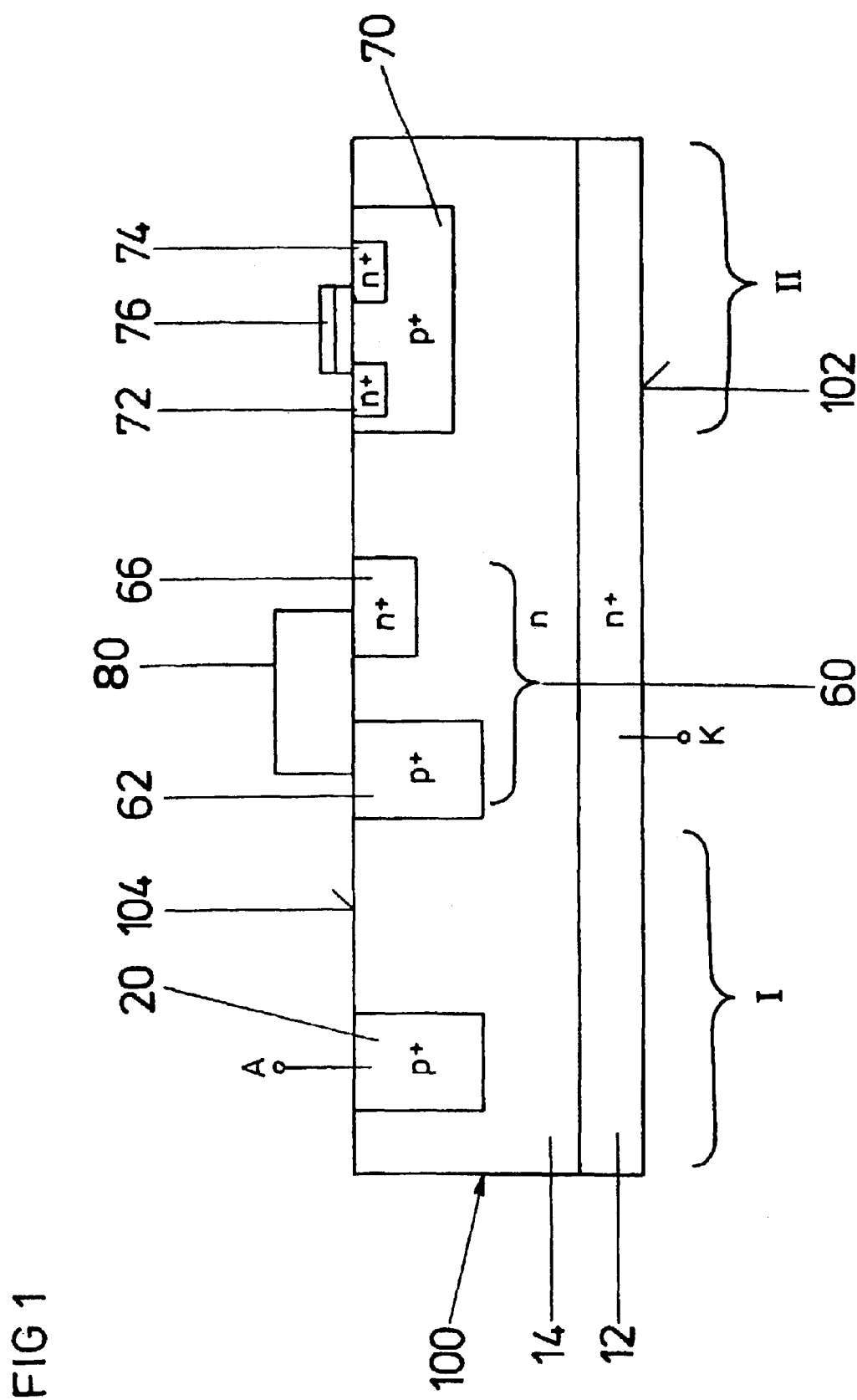
FIG. 1 is a fragmentary, cross-sectional view of an exemplary embodiment of an integrated circuit configuration according to the invention with a diode as a vertical power component.

Referring now to the figures of the drawings in detail and first, particularly to FIG. 1 thereof, there is shown a first exemplary embodiment of an integrated circuit configuration according to the invention, which has a semiconductor body 100 having a first heavily n-doped semiconductor zone 12 in the region of a rear side 102 of the semiconductor body 100 and a second semiconductor zone 14 of the first conductivity type in the region of a front side 104 of the semiconductor body 100, the second semiconductor zone 14 directly adjoining the first semiconductor zone 12, the second semiconductor zone 14 being doped more weakly than the first semiconductor zone 12. The first semiconductor zone 12 is configured, for example, as a semiconductor substrate to which the second semiconductor zone 14 is applied as an epitaxial layer.

The first semiconductor body 100 is subdivided into a first component region I and a second component region II, heavily p-doped zones 20, 70 being formed both in the first component region I and in the second component region II, the zones 20, 70 extending into the semiconductor body 100 proceeding from the front side 104.

The heavily p-doped zone 20 in the first component region I is part of a vertical power component, which is configured as a diode in the example and whose anode A is formed by the p-doped zone 20 and whose cathode K is formed by the semiconductor substrate 12. The second semiconductor zone 14 forms the drift zone of the diode.

The p-doped zone 70 in the second component region II represents a part of a control and/or evaluation circuit, there being formed in the p-doped zone, for illustration purposes, a lateral n-conducting MOS transistor whose source and drain zones are formed by two heavily n-doped zones 72, 74, and whose gate electrode 76 is formed in an insulated manner above the front side 104 of the semiconductor body 100.

If the power diode in the component region I is operated in the forward direction, i.e., if a more positive potential is applied to the anode A than to the cathode K, then holes are injected into the epitaxial layer 14. To prevent the holes from propagating in the lateral direction in the epitaxial layer 14 and passing into the p-doped zone 70 in the component region II, where they might drive the parasitic bipolar transistor formed by the semiconductor zones 70, 72, and 74, according to the invention, a conversion structure 60 is provided between the first component region I and the component region II. The conversion structure 60 includes a heavily p-doped zone 62 and a heavily n-doped zone 66, which extend into the semiconductor body 100 in each case proceeding from the front side 104 and which are disposed at a distance from the heavily n-doped semiconductor substrate 12. The p-doped zone 62 and the n-doped zone 66 are short-circuited, which is illustrated diagrammatically by a line 80 connection in FIG. 1.

Holes that are injected through the p-doped zone 20 into the epitaxial layer 14 and that pass right into the region of the conversion structure 60 are taken up by the heavily p-doped zone 62, which leads to a current flow from the heavily p-doped zone 62 through the short circuit to the heavily n-doped zone 66, as a result of which the heavily n-doped zone 66 injects electrons into the epitaxial layer 14. In the epitaxial layer 14, which also forms the drift zone of the vertical power diode, electrons represent the majority charge carriers that are conducted away through the heavily n-doped semiconductor zone 12.

Figure 2:
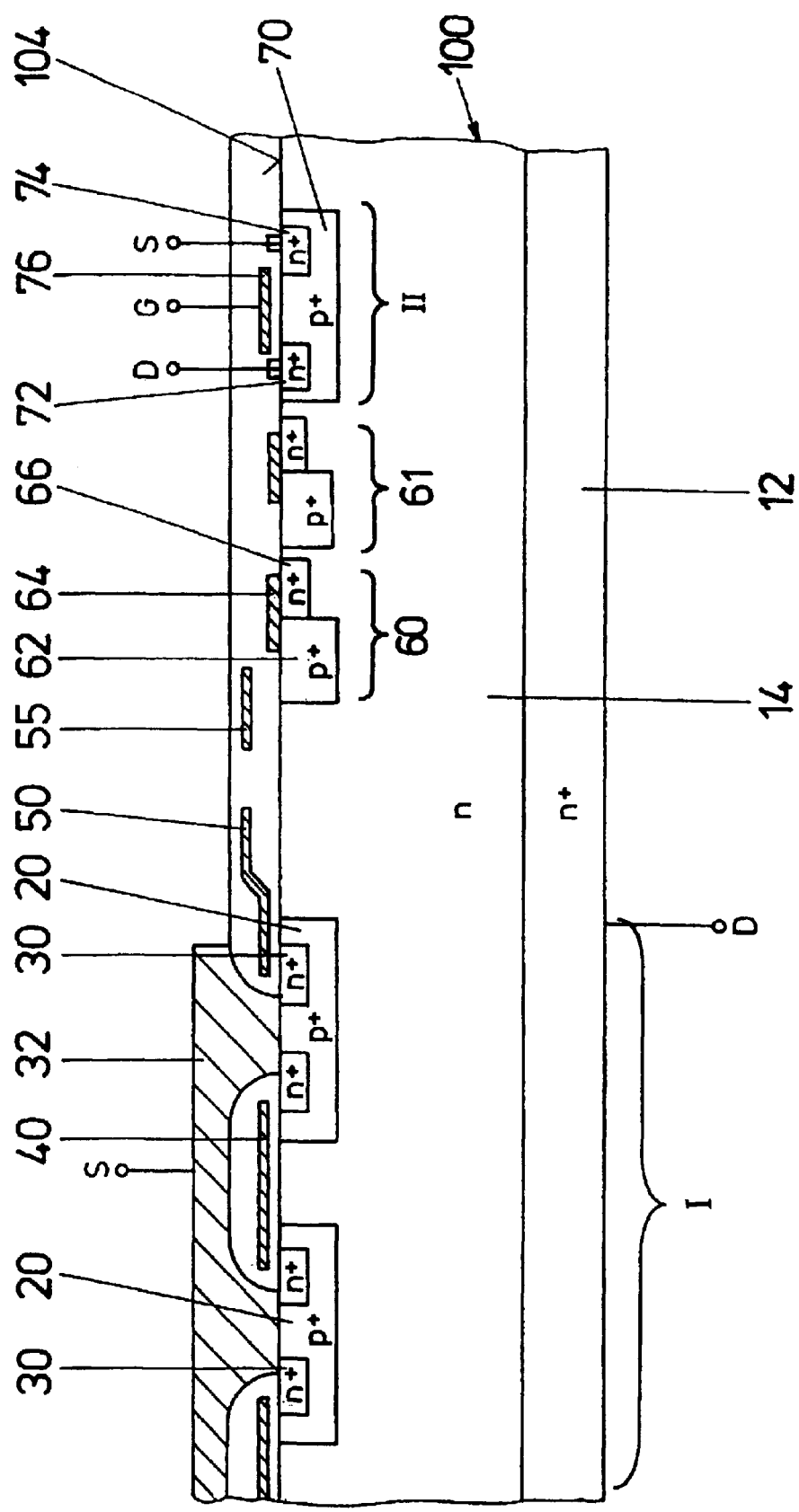
FIG. 2 is a fragmentary, cross-sectional view of a further exemplary embodiment of an integrated circuit configuration according to the invention with a MOS transistor as a vertical power component.

In the exemplary embodiment, the heavily p-doped zone 62 and the heavily n-doped zone 66 are disposed at a distance from one another; these two zones can also be disposed directly adjacent to one another, as can be gathered from the exemplary embodiments in FIG. 2.

FIG. 2 shows a further exemplary embodiment of an integrated circuit configuration, which differs from the circuit configuration illustrated in FIG. 1 by virtue of the fact that the vertical power component in the component region I is formed as an n-conducting MOS transistor. In such a case, the p-doped zones 20 in the epitaxial layer 14 form the body zone of the MOS transistor. A heavily n-doped source zone 30 is formed in the body zone 20. A gate electrode 40 is present in a manner insulated from the semiconductor body 100, the gate electrode 40 being disposed above the semi-conductor body 100 adjacent to the source zone 30 and the body zone 20 in the exemplary embodiment. The MOS transistor is constructed cellularly, i.e., there are a multiplicity of identical structures each having a body zone 20 and source zones 30.

The source zone 30 and the body zone 20 are contact-connected by a source electrode 32, the source electrode 32, S short-circuiting the body zone 20 and the source zone 30. The drain terminal D of the MOS transistor is formed by the semiconductor substrate 12.

If the MOS transistor is operated in the forward direction, i.e., if a positive voltage is applied between its drain terminal D and its source terminal S, no holes are injected into the epitaxial layer. If the polarity of the voltage across the MOS transistor is reversed, which can occur for example, during the driving of inductive loads by the MOS transistor, then the freewheeling diode becomes active, which is formed by the pn junction between the p-doped body zone 20 and the epitaxial layer 14, and whose anode terminal is the source terminal S and whose cathode terminal is the drain terminal D of the MOS transistor.

As already explained above for the first exemplary embodiment, holes are injected into the epitaxial layer in such an operating state, holes that pass right into the region of one or more conversion structures 60, 61 being converted there into majority charge carriers and being conducted away through the epitaxial layer into the semiconductor substrate 12.

The doping difference between the semiconductor substrate 12 and the epitaxial layer 14 brings about a drift field that prevents the holes injected into the p-doped zone 20 from passing into the semiconductor substrate 12, and, thus, reinforces the effect that the holes are fed to the heavily p-doped zone 62 of the conversion structure for a "conversion" of the holes as minority charge carriers into electrons as majority charge carriers.

Preferably, a plurality of conversion structures of the embodiments illustrated in FIGS. 1 and 2 are disposed between the first component region I and the second component region II to, as far as possible, completely prevent a propagation of holes right into the second component region II.

In the example in accordance with FIG. 2, the short circuit between the heavily p-doped zone 62 and the heavily n-doped zone 66, which directly adjoin one another in the case of the conversion structure 60 in accordance with FIG. 2, is realized by a connection structure 64 that is applied on the front side 104 of the semiconductor body and that is composed, for example, of a metal or of polysilicon.

Moreover, in the exemplary embodiment in accordance with FIG. 2, field plate structures 50, 55 are present, which prevent a voltage breakdown in the edge region of the MOS transistor.

Figure 3:
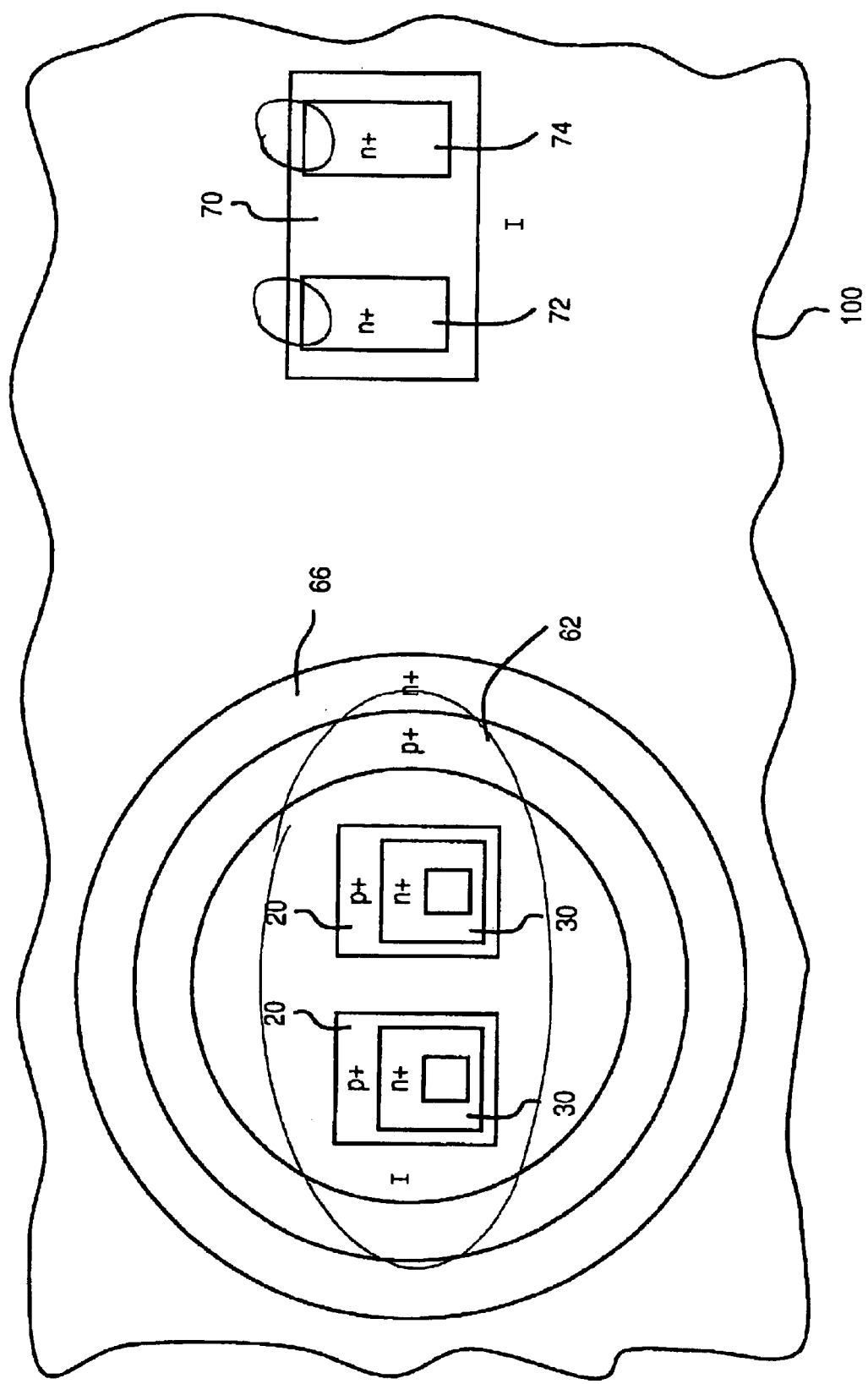
FIG. 3 is a fragmentary, diagrammatic plan view of a ring-shaped converting structure of FIG. 2.

FIG. 3 is a plan view of the configuration of FIG. 2 illustrating the ring-shaped converting structure 62, 66 disposed around the component area, here, depicting, for example, two transistor cells 20, 30.

We claim:

1. An integrated circuit configuration, comprising:

a semiconductor body having:
 a rear side;
 a front side;
 a first semiconductor zone of a first conductivity type in a region of said rear side; and
 a second semiconductor zone of said first conductivity type adjoining said first semiconductor zone, said second semiconductor zone doped weaker than said first semiconductor zone and disposed in a region of said front side;

a first component region in said semiconductor body having at least one semiconductor zone of a second conductivity type;

a second component region in said semiconductor body having at least one semiconductor zone of said second conductivity type; and a conversion structure having a first structure semiconductor zone of said second conductivity type and a second structure semiconductor zone of said first conductivity type, said first structure semiconductor zone and said second structure semiconductor zone being short-circuited and respectively disposed at a distance from said first semiconductor zone in said second semiconductor zone between said first and second component regions and directly adjoin said second semiconductor zone, said conversion structure inhibiting a propagation of minority charge carriers between said first and second component regions.

2. The integrated circuit configuration according to claim 1, including a vertical semiconductor component having at least a first and a second terminal electrode, said first terminal electrode connected to said first semiconductor zone and said second terminal electrode connected to said at least one semiconductor zone of said second conductivity type, said at least one semiconductor zone of said second conductivity type in said second semiconductor zone in said first component region being part of said vertical semiconductor component.

3. The integrated circuit configuration according to claim 2, including semiconductor portions of said first conductivity type connected to said second terminal electrode, said semiconductor portions disposed in said at least one semiconductor zone of said second conductivity type in said second semiconductor zone.

4. The integrated circuit configuration according to claim 3, including a control electrode in said first component region insulated from said semiconductor body adjacent said at least one semiconductor zone of said second conductivity type and at least one of said semiconductor portions of said first conductivity type, said at least one semiconductor zone being formed in said at least one semiconductor zone of said second conductivity type.

5. The integrated circuit configuration according to claim 1, including at least one further semiconductor zone of said first conductivity type disposed in said at least one semiconductor zone of said second conductivity type in said second semiconductor zone in said first component region.

6. The integrated circuit configuration according to claim 3, wherein at least two of said semiconductor portions of said first conductivity type are disposed in said at least one semiconductor zone of said second conductivity type in said second semiconductor zone in said first component region.

7. The integrated circuit configuration according to claim 1, wherein said first and second structure zones of said conversion structure directly adjoin one another.

8. The integrated circuit configuration according to claim 1, wherein said conversion structure is a plurality of conversion structures each with a first structure semiconductor zone of said second conductivity type and a second structure semiconductor zone of said first conductivity type disposed next to one another between said first and second component regions.

9. The integrated circuit configuration according to claim 1, wherein said conversion structure is formed annularly around said first component region.

* * * * *